(12) United States Patent
Koki et al.

(10) Patent No.: US 6,680,560 B2
(45) Date of Patent: Jan. 20, 2004

(54) HEAT RESISTANT QUARTZ-CRYSTAL UNIT

(75) Inventors: Genwa Koki, Saitama (JP); Mikio Saito, Saitama (JP); Shigeru Obara, Saitama (JP); Mituaki Koyama, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/298,623

(22) Filed: Nov. 15, 2002

(65) Prior Publication Data

US 2003/0102778 A1 Jun. 5, 2003

(30) Foreign Application Priority Data

Nov. 19, 2001 (JP) ........................................ 2001-352807

(51) Int. Cl.⁷ ............................................ H01L 41/053
(52) U.S. Cl. ........................ 310/348; 310/312; 310/344; 310/346; 29/25.35
(58) Field of Search ................................. 310/312, 340, 310/344, 346, 348, 352; 29/25.35

(56) References Cited

U.S. PATENT DOCUMENTS 5,406,682 A * 4/1995 Zimnicki et al. .......... 29/25.35
6,359,532 B1 * 3/2002 Sugiyama et al. .......... 333/189

FOREIGN PATENT DOCUMENTS

JP 57-212814 * 12/1982 ................. 310/348

* cited by examiner

Primary Examiner—Thomas M. Dougherty
(74) Attorney, Agent, or Firm—Knobbe Martens Olson & Bear, LLP

(57) ABSTRACT

In a crystal unit suitable for use in a thermostat oven, a first and a second excitation electrode are disposed on a first and a second surface of a crystal blank. A first and a second connection are disposed on the second surface as connections formed by applying a fillet of a mixture of a low-melting glass and a metal filler, and melting the fillet by heating. A third connection is disposed on a peripheral edge of the crystal blank to extend over both surfaces. A lead of the first excitation electrode is directly connected to the third connection, while a lead of the second excitation electrode is connected to the first connection through a vapor-deposited metal thin film. The second and third connections are connected to each other through a vapor-deposited metal thin film. The first and second connections are secured to a pair of holding members by brazing.

14 Claims, 3 Drawing Sheets

HEAT RESISTANT QUARTZ-CRYSTAL UNIT

BACKGROUND OF THE INVENTION

1. Field of the Invention

The present invention relates to a quartz-crystal unit, and more particularly, to a crystal unit which is suitable for applications that require heat resistance.

2. Description of the Related Art

It is widely known that a quartz-crystal oscillator using a quartz-crystal unit provides a stable oscillation frequency. The influence exerted by a change in temperature is the largest factor which contributes to fluctuations in the oscillation frequency of the crystal oscillator. For example, a crystal oscillator using an AT cut crystal unit, which is most often employed, presents a change in frequency in a range of several tens to several hundreds of ppm to a change in temperature from −30° C. to +80° C. For this reason, a crystal oscillator for use in applications which require a stable frequency source such as measuring instruments, base stations of a mobile communication system, and the like is an oven-controlled type one which accommodates a crystal unit in a thermostatic oven. The oven-controlled type crystal oscillator prevents a change in oscillation frequency due to a change in temperature by accommodating the crystal unit in the thermostatic oven which is heated at a constant temperature of approximately +80° C. In this way, the crystal unit for use in the oven-controlled type crystal oscillator is used in a high temperature environment at approximately +80° C.

On the other hand, a crystal unit used at temperatures near a room temperature typically has excitation electrodes formed on both surfaces of a quartz crystal blank and extended to edges of their respective surfaces.

Then, the crystal blank is held at extreme ends of the extended excitation electrodes by holding members, each of which comprise a wire, a thin metal plate, or the like formed with a clip at a leading end thereof. A conductive adhesive is further applied on the sites at which the crystal blank is held to ensure secure fixation of the crystal blank and to make electric conduction between the holding members and excitation electrodes. The conductive adhesive for use in this case may be, for example, a mixture of an adhesive based on epoxy resin and thin pieces, grains, or the like of silver.

However, when a crystal unit using a conductive adhesive is placed in a high temperature environment, a gas component generated from organic components of the adhesive, in particular, sticks on the excitation electrodes, causing a change over time in the resonant frequency of the crystal unit, i.e., the oscillation frequency of a crystal oscillator over time. Therefore, if a crystal unit for use in room temperatures as described above is used in an oven-controlled type crystal oscillator, the crystal unit of which is exposed to high temperatures of approximately +80° C., the oscillation frequency will change over time.

To solve this problem, a structure as illustrated in FIG. 1 is contemplated for a crystal unit for use in a thermostatic oven. The crystal unit illustrated in FIG. 1 has two terminals 22 extending through base 21, and holding member 23 attached at the leading end of each terminal 22.

On the other hand, both side ends of disk-shaped crystal blank 24 are applied with a fillet comprised of a mixture of a low-melting glass and a silver filler, which is heated to a temperature exceeding 400° C., at which the fillet is molten, to form connections 26. Since the low-melting glass is chemically similar to quartz in components, it can firmly secure and form connections 26 at predetermined positions of crystal blank 24. Then, excitation electrodes 25 are formed by vapor deposition at the centers of top and bottom faces of crystal blank 24, opposite to each other. Excitation electrodes 25 are extended in directions opposite to each other to positions spaced by a predetermined distance from connections 26 at the ends of the surfaces.

Then, connections 26 of crystal blank 24 are held by holding members 23, and a brazing material composed of gold and germanium (Au—Ge), used to form a eutectic alloy, is heated to approximately 350° C. to bond holding members 23 to connections 26.

When bonding by the gold-germanium brazing material is performed under the condition that excitation electrodes 25 directly contact with holding members 23, excitation electrodes 25 are eroded by electrolytic etching, disadvantageously causing degeneration of excitation electrodes 25 and resulting gradual change in the resonant frequency. In extreme cases, crystal blank 24 could come off holding members 23. However, when connections 26 mainly composed of silver are formed such that spacings are defined between connections 26 and excitation electrodes 25, connections 26 can be securely bonded to holding members 23 using the gold-germanium brazing material without adversely affecting excitation electrodes 25.

Then, metal thin films 27 are vapor deposited on the top and bottom faces of crystal blank 24 to cover the extended ends of excitation electrodes 25 and connections 26, thereby providing electric conduction between excitation electrodes 25 and connections 26.

Subsequently, a trace of metal film is additionally vapor deposited on excitation electrodes 25 to finely adjust the resonant frequency of crystal blank 24 to a target frequency by its mass addition effect.

Then, cover 28 having an open lower end is fitted over base 21, and the opening end is bonded to a flange along the peripheral edge of base 21 by soldering, cold pressure welding, or the like, with the internal space of cover 28 placed in an inert gas or vacuum atmosphere, to hermetically encapsulate crystal blank 24.

The conventional heat resistant crystal unit is assembled in the foregoing manner. In the conventional crystal unit, crystal blank 24 is held in a direction perpendicular to base 21.

In recent years, however, surface mount devices tend to be more often used in a variety of electric devices for purposes of automated assembling processes, reduction in size, and the like. The surface mount type is also required for the crystal unit. A surface mount crystal unit employs, for example, a container which has a base made of ceramic. The base has outer shape in a rectangular parallelepiped and is formed with a recess on the top face. With this container, after a crystal blank is accommodated in the recess, a metal-made lid is seam welded along the opening of the recess to encapsulate the crystal blank. Therefore, in such a surface mount crystal unit, the crystal blank is accommodated in the recess of the base in parallel with the bottom face thereof. Thus, if connections of the crystal blank are secured to holding members formed on the bottom face of the recess with a gold-germanium brazing material for forming a heat resistant crystal unit of the structure described above, excitation electrodes below the crystal blank cannot be applied with vapor deposition and the like. This results in a problem that the underlying excitation electrode cannot be electrically connected to the holding member.

Also, some crystal units of a general type having lead lines, not for surface mounting, can hold a crystal blank horizontally on a holding member disposed on a base. Such a crystal unit is similar in that a lower surface of the crystal blank cannot be applied with vapor deposition and the like when the crystal blank is held by the holding member. In this structure, therefore, underlying excitation electrodes cannot either be electrically connected to the holding member.

SUMMARY OF THE INVENTION

It is an object of the present invention to provide a crystal unit which has good heat resistance, wherein a crystal blank is held horizontally to a base and securely fixed to holding members with a gold-germanium brazing material, and excitation electrodes on the top and bottom faces of the crystal blank are connected to the holding members by vapor deposition.

The object of the present invention is achieved by a crystal unit which includes a base, a pair of holding members attached to the base, a crystal blank formed in a plate shape for exciting piezoelectric vibrations and having a first and a second surface, a first and a second connection each formed on the second surface by applying a fillet including a mixture of a low-melting glass and a metal filler, and melting the fillet by heating, a third connection formed at an end of the crystal blank to extend over both of the first and second surfaces by applying a fillet including a low-melting glass and a metal filler, and melting the fillet by heating, a first excitation electrode formed on the first surface and having a first lead electrically conducting to the third connection, a second excitation electrode formed on the second surface corresponding to the first excitation electrode and having a second lead arranged a predetermined spacing apart from the first connection, a first metal thin film for making electric conduction between the second lead and the first connection, and a second metal thin film for making electric conduction between the second connection and the third connection. The first and second connections are brazed to the pair of holding members, respectively.

According to the present invention, the crystal unit provided thereby holds the surfaces of the crystal blank in parallel with the base, and exhibits high heat resistance which makes it suitable for use in a thermostat oven heated at a constant temperature.

DETAILED DESCRIPTION OF THE INVENTION

Figure 1:
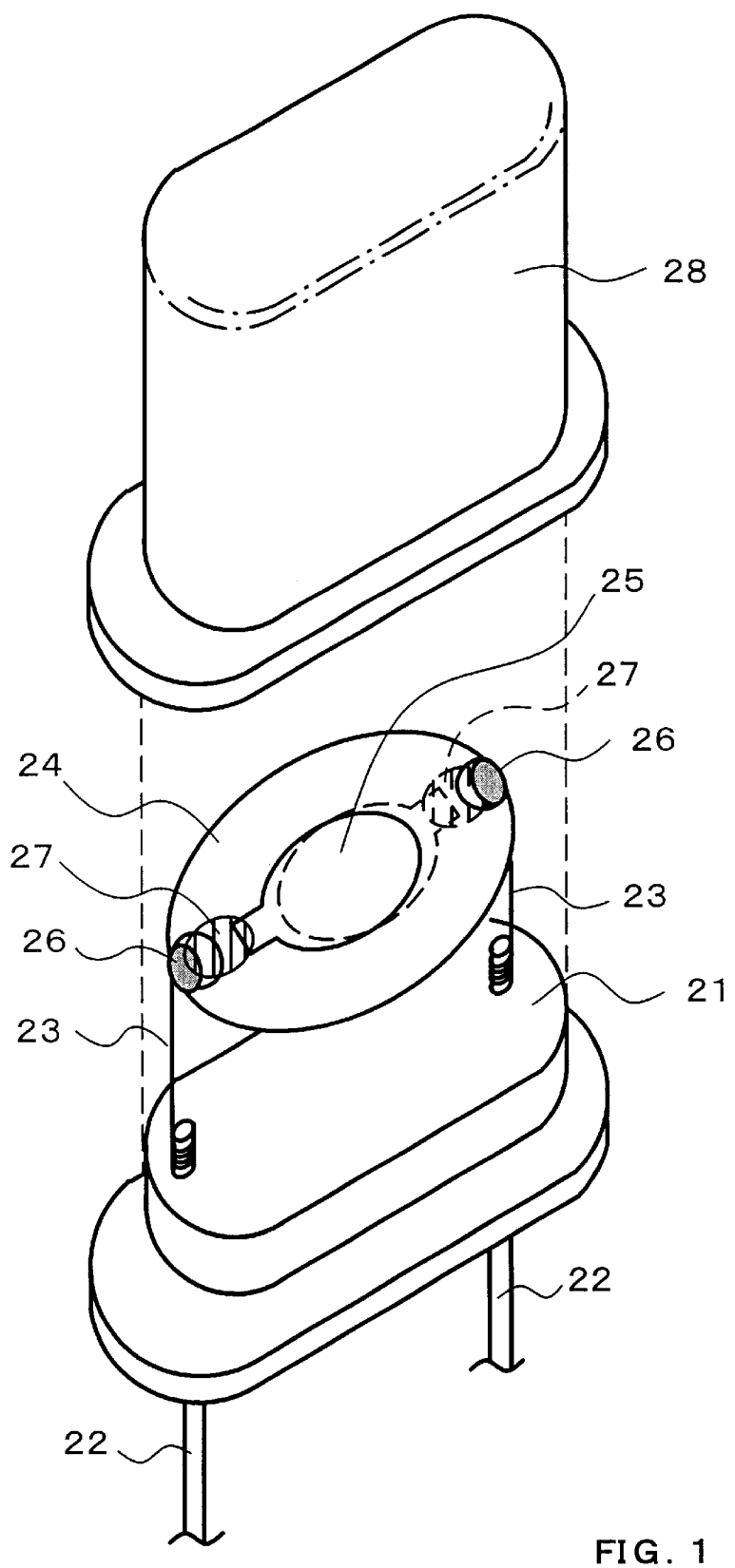
FIG. 1 is an exploded perspective view illustrating an example of a conventional heat resistant crystal unit.
Figure 2:
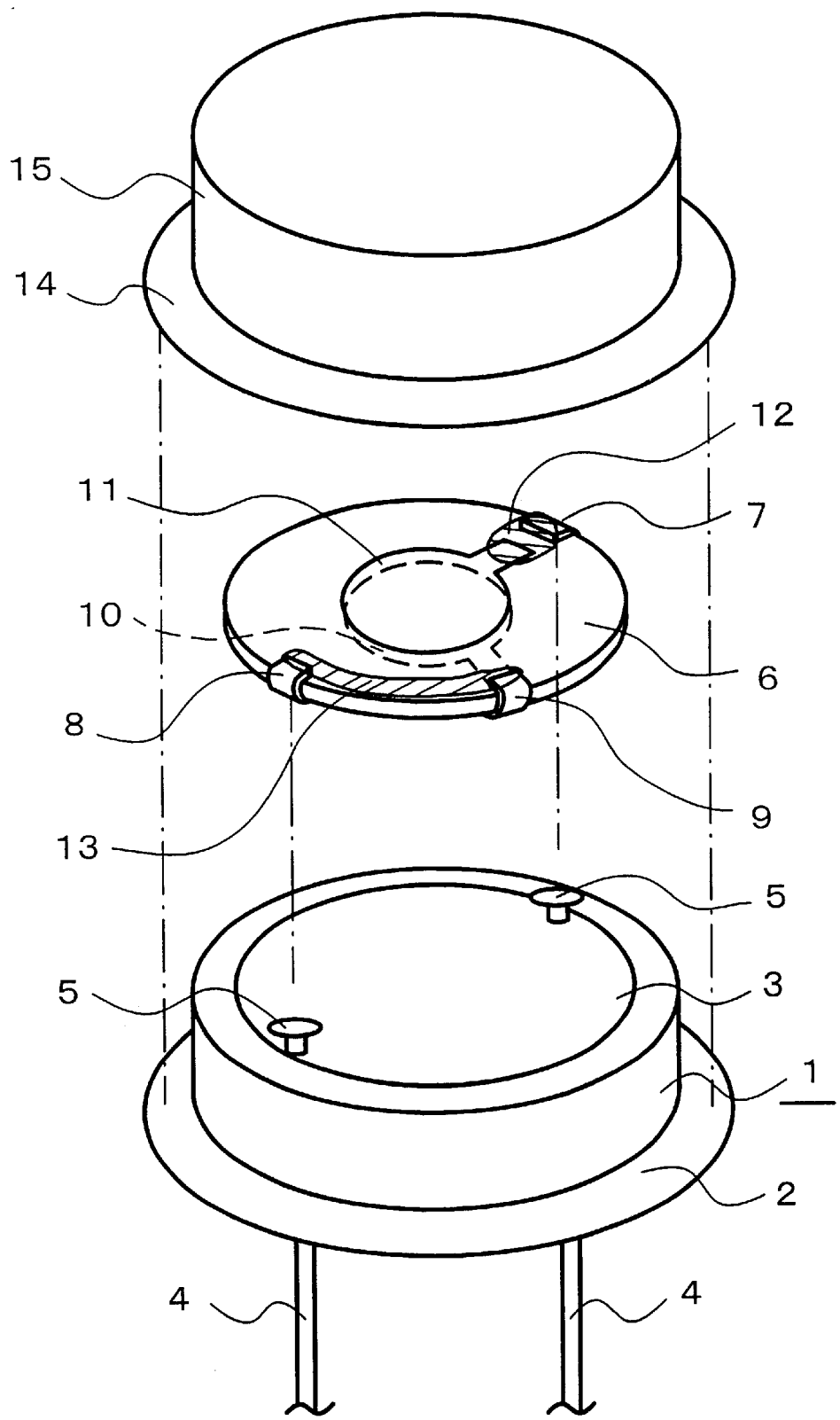
FIG. 2 is an exploded perspective view illustrating a heat resistant crystal unit according to one embodiment of the present invention.

A crystal unit according to one embodiment of the present invention illustrated in FIG. 2 comprises a pair of lead terminals 4 implanted on base 1. Base 1, which has a substantially discoid shape, is formed with flange 2 along its outer peripheral edge by machining a metal plate. Base 1 is filled with glass 3 in a central portion thereof for hermetical sealing. The pair of terminals 4, electrically insulated from each other, extend through glass 3. Holding member 5 having a nail head shape is formed at the leading end of each terminal 4.

Crystal blank 6 is formed into a circular plate shape by cutting an artificial quartz crystal at a predetermined angle to its crystal axis. First and second connections 7, 8 are formed at positions corresponding to holding members 5 on the peripheral edge of crystal blank 6 by applying a fillet, which is a mixture of a low-melting glass and a metal filler, and melting the fillet by heating. First and second connections 7, 8 are positioned opposite to each other across the center of crystal blank 3. Third connection 9 is further formed a predetermined spacing apart from second connection 8 on the peripheral edge of crystal blank 6 by applying a fillet, which is a mixture of a low-melting glass and a metal filler, to extend over both surfaces of crystal blank 6, and melting the fillet by heating.

First excitation electrode 10 is formed on one surface of crystal blank 6 such that its lead electrically conducts to third connection 9. On the other hand, second excitation electrode 11 is formed on the other surface of crystal blank 6, corresponding to the position of the first excitation electrode 10. A lead of second excitation electrode 11 is formed a predetermined spacing apart from first connection 7. Excitation electrodes 10, 11 may be formed, for example, by vapor deposition.

Crystal blank 6 is held by a pair of holding members 5 by securing first and second connections 7, 8 to holding members 5 with a gold-germanium brazing material. In this event, crystal blank 6, which is formed with first to third connections 7 to 9 and first and second excitation electrodes 10, 11 as described above, is secured such that one surface thereof is in parallel with and opposite to the top face of base 1. Subsequently, a metal is vapor deposited on the other surface of crystal blank 6, such that the lead of second excitation electrode 11 and first connection 7 are covered with vapor-deposited metal 12, thereby making electric conduction between second excitation electrode 11 and first connection 7 through vapor-deposited metal 12. Similarly, a metal is vapor deposited such that vapor-deposited metal 13 covers between second connection 8 and third connection 9, thereby making electric conduction between second connection 8 and third connection 9 through vapor-deposited metal 13. In this event, a trace of metal is vapor deposited on second excitation electrode 11 of crystal blank 6 as required to accurately adjust the resonant frequency by its mass addition effect.

Then, cover 15 is fitted over base 1. Cover 15 has an opening on the bottom face and flange 14 formed along the edge of the opening. Flange 2 of base 1 is bonded to flange 14 of cover 15 by a suitable means such as soldering, pressure welding, or the like, to hermetically encapsulate crystal blank 6. The encapsulation should be performed in a vacuum or an inert gas atmosphere to prevent a chemical change in excitation electrodes 10, 11 and the like after the encapsulation.

With the crystal unit constructed as described above, first excitation electrode 10 is electrically connected to one terminal 4 through third connection 9, vapor-deposited metal 13, second connection 8, gold-germanium brazing material, and holding member 5. Second excitation electrode 11 in turn is electrically connected to the other terminal 4 through vapor-deposited metal 12, first connection 7, gold-germanium brazing material, and holding member 5. Therefore, crystal blank 6 can be forced to excite piezoelectric vibrations to generate a stable oscillation frequency by connecting a pair of terminals 4 to an appropriate crystal oscillator circuit.

Since no material such as an organic adhesive, which could produce a gas at high temperatures, is used in the space in which crystal blank 6 is encapsulated, the crystal unit can provide an extremely high frequency stability without aging changes even if it is used in a thermostatic oven at approximately +80° C.

Figure 3:
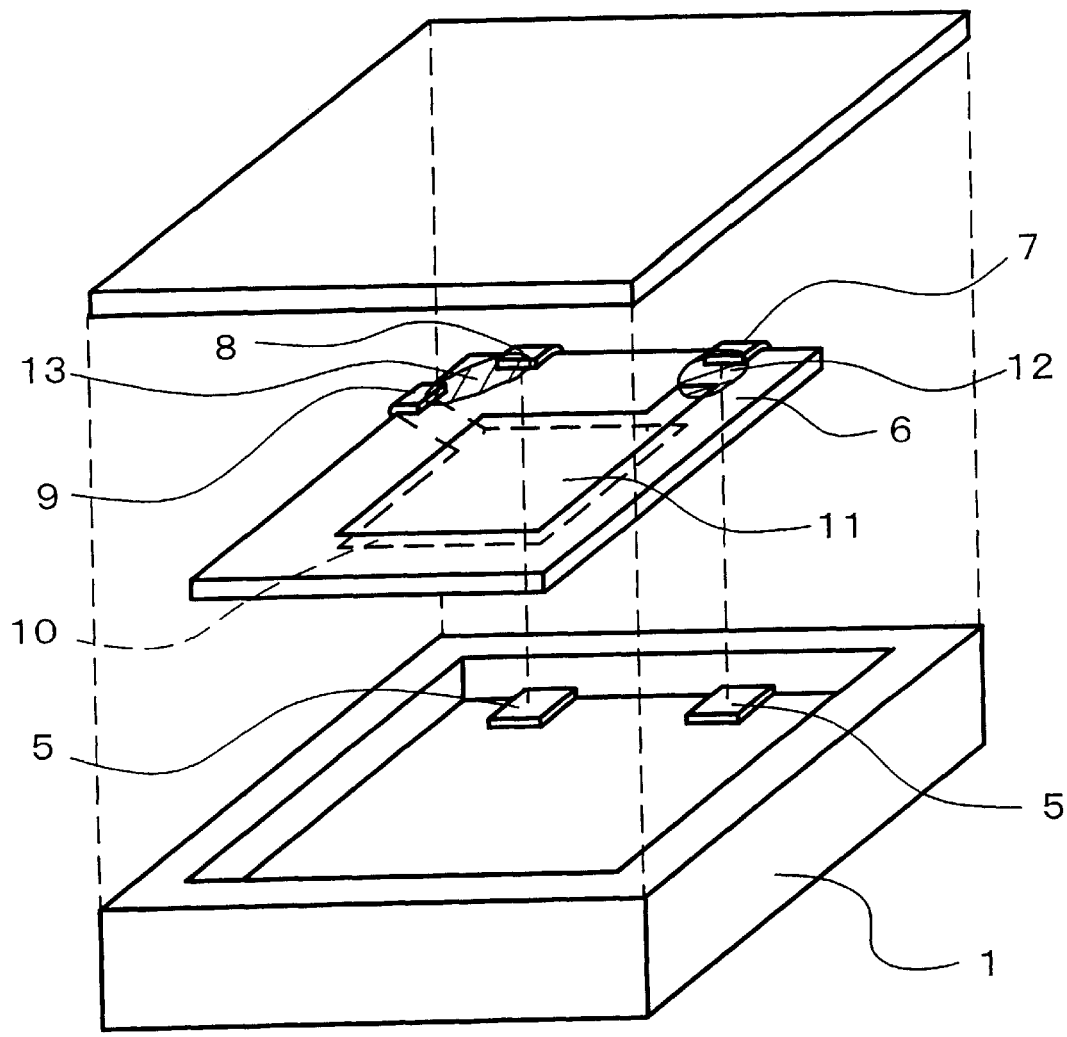
FIG. 3 is an exploded perspective view illustrating a heat resistant crystal unit according to anther embodiment of the present invention.

While a preferred embodiment of the present invention has been described above, the present invention is not limited to the foregoing embodiment. For example, the present invention can be applied to a surface mount crystal unit as illustrated in FIG. 3. In FIG. 3, members identical to those in FIG. 2 are designated the same reference numerals.

In the surface mount crystal unit illustrated in FIG. 3, base 1, for example, made by sintered ceramic, is formed into a box which has a substantially rectangular opening on the top face. A pair of holding members 5 are disposed on the bottom face of an internal space defined by the opening. Holding members 5 electrically connects to mounting electrodes (not shown) disposed on the outer bottom face of base 1, i.e., ceramic container, through via holes or the like. The mounting electrodes are used for mounting the crystal unit on a printed wiring board, for example, by soldering.

Crystal blank 6 in substantially rectangular shape is formed with first and second connections 7, 8 corresponding to the positions of holding members 5 by melting a fillet, which is a mixture of a low-melting glass and a metal filler, by heating. Third connection 9 is formed a predetermined spacing apart from second connection 8 on the peripheral edge of crystal blank 6 by similarly melting the fillet by heating. Third connection 9 is formed to extend over both surfaces of crystal blank 6.

First excitation electrode 10 is formed on one surface of crystal blank 6 by vapor deposition, and a lead of excitation electrode 10 is led out for electric conduction to third connection 9. Second excitation electrode 11 is formed on the other surface of crystal blank 6 by vapor deposition. A lead of second excitation electrode 11 is formed a predetermined spacing apart from first connection 7.

Crystal blank 6 thus formed with connections 7 to 9 and excitation electrodes 10, 11 is electrically connected to holding members 5 and held in the opening of base 1 by placing crystal blank 6 with its surface formed with first excitation electrode 10 opposing the bottom face of base 1, and securing first and second connections 7, 8 to holding members 7 with a gold-germanium brazing material.

Subsequently, metal thin film 12 is vapor deposited on the top face of base 1, i.e., the surface of crystal blank 6 formed with second excitation electrode 11, to make electric conduction between second excitation electrode 11 and first connection 7 through metal thin film 12 formed by vapor deposition. Similarly, metal thin film 13 is vapor deposited between second and third connections 8, 9 to make electric conduction therebetween through metal thin film 13 formed by vapor deposition. A trace of metal is further vapor deposited on second excitation electrode 11 as required to accurately adjust the resonant frequency of crystal blank 6 by its mass addition effect.

Subsequently, cover 15 is put on the opening of the top face of base 1 in a vacuum, a nitrogen gas, or an inert gas atmosphere to hermetically encapsulate crystal blank 6.

It should be understood that the surface mounted crystal unit as described above provides similar advantages to the crystal unit having lead terminals, illustrated in FIG. 2.

What is claimed is:
1. A crystal unit comprising:
a base;
a pair of holding members attached to said base;
a crystal blank formed in a plate shape for exciting piezoelectric vibrations, said crystal blank having a first and a second surface;
a first and a second connection each formed on said second surface by applying a fillet including a mixture of a low-melting glass and a metal filler, and melting the fillet by heating;
a third connection formed at an end of said crystal blank to extend over both of said first and second surfaces by applying a fillet including a low-melting glass and a metal filler, and melting the fillet by heating;
a first excitation electrode formed on said first surface and having a first lead electrically conducting to said third connection;
a second excitation electrode formed on said second surface corresponding to said first excitation electrode and having a second lead, said second lead being arranged a predetermined spacing apart from said first connection;
a first metal thin film for making electric conduction between said second lead and said first connection; and
a second metal thin film for making electric conduction between said second connection and said third connection,
said first and second connections being brazed to said pair of holding members, respectively.

2. The crystal unit according to claim 1, wherein said crystal blank is held horizontally to said base such that said first surface opposes said base.

3. The crystal unit according to claim 1, wherein said first and second connections are brazed to said pair of holding members with a gold-germanium alloy.

4. The crystal unit according to claim 1, wherein said first and second metal thin films comprise vapor-deposited films.

5. The crystal unit according to claim 1, further comprising a pair of terminals extending through said base, wherein said pair of holding members are formed at leading ends of said pair of terminals, respectively.

6. The crystal unit according to claim 5, wherein said crystal blank has a substantially circular shape, and said first and second connections are formed on an outer peripheral edge of said crystal blank corresponding to said pair of holding members such that said first and second connections oppose each other across the center of said crystal blank.

7. The crystal unit according to claim 6, further comprising a cover bonded to said base, wherein said crystal blank is hermetically encapsulated in a space surrounded by said base and said cover.

8. The crystal unit according to claim 1, wherein said base is a container made of ceramic for surface mounting.

9. The crystal unit according to claim 8, wherein said base includes a recess having an opening on a top face, and said pair of holding members are formed on a bottom face of said recess.

10. The crystal unit according to claim 9, wherein said crystal blank has a substantially rectangular shape, and said first and second connections are formed at both ends of one side of said crystal blank corresponding to said pair of holding members.

11. The crystal unit according to claim 10, further comprising a cover bonded to the top face of said base, wherein said crystal blank is hermetically encapsulated in said recess.

12. A crystal unit comprising: a base; a pair of holding members attached to said base; a crystal blank plate for exciting piezoelectric vibrations having an upper and a lower surface; an upper excitation electrode formed on said upper surface; a lower excitation electrode formed on said lower surface; a first and a second connection both formed on said upper surface and brazed to the respective holding members; and a third connection formed on said upper surface extending to said lower surface and electrically connected to the lower excitation electrode, wherein said upper excitation electrode and said first connection are connected by a first metal film formed on said upper surface by vapor deposition, and said second connection and said third connection are connected by a second metal film formed on said upper surface by vapor deposition.

13. A method for producing a crystal unit comprising the steps of:

providing a crystal blank plate for exciting piezoelectric vibrations having an upper and a lower surface, said plate comprising an upper excitation electrode formed on said upper surface; a lower excitation electrode formed on said lower surface; a first and a second connection both formed on said upper surface; and a third connection formed on said upper surface extending to said lower surface and electrically connected to the lower excitation electrode;

brazing said first and second connections to said respective holding members; and conducting vapor deposition on said upper surface to form a first metal film connecting said upper excitation electrode and said first connection, and a second metal film connecting said second connection and said third connection.

14. The method according to claim 13, further comprising conducting vapor deposition on said upper surface to depositing a trace of metal on the upper excitation electrode for adjusting the resonant frequency of the crystal blank plate.

* * * * *